(12) United States Patent
Lin et al.

(10) Patent No.: US 11,532,469 B1
(45) Date of Patent: Dec. 20, 2022

(54) SHIELDING DEVICE AND THIN-FILM-DEPOSITION EQUIPMENT WITH THE SAME

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

(21) Appl. No.: 17/484,654

(22) Filed: Sep. 24, 2021

(30) Foreign Application Priority Data

Jun. 29, 2021 (TW) .................................. 110123820

(51) Int. Cl.
*H01J 37/34* (2006.01)
*C23C 14/34* (2006.01)

(52) U.S. Cl.
CPC .......... *H01J 37/3441* (2013.01); *C23C 14/34* (2013.01); *H01J 2237/332* (2013.01)

(58) Field of Classification Search
CPC ............. H01J 37/32651; H01J 37/3441; H01J 37/3447; H01J 2237/332; C23C 14/34

USPC ............................. 204/298.11; 118/720, 721
See application file for complete search history.

(56) References Cited

U.S. PATENT DOCUMENTS

| | | | |
|---|---|---|---|
| 6,511,585 B1 * | 1/2003 | Shi ..................... | H01J 37/32055 118/723 VE |
| 2003/0155234 A1 * | 8/2003 | Feltsman .............. | C23C 14/566 118/712 |
| 2004/0182698 A1 * | 9/2004 | Feltsman .............. | C23C 14/566 204/298.11 |
| 2021/0118653 A1 * | 4/2021 | Shinada ............ | H01J 37/32715 |

* cited by examiner

*Primary Examiner* — Rodney G McDonald
(74) *Attorney, Agent, or Firm* — Chun-Ming Shih; HDLS IPR Services

(57) ABSTRACT

The present disclosure provides a thin-film-deposition equipment with shielding device, which includes a reaction chamber, a carrier and a shielding device. The shielding device includes a first-carry arm, a second-carry arm, a first-shield member, a second-shield member and a driver. The driver interconnects the first-carry arm and the second first-carry arm, for driving and swinging the first-shield member and the second-shield member to move in opposite directions via the first-carry arm and the second first-carry arm. During a cleaning process, the driver swings the shield members toward each other into a shielding state for covering the carrier, such that to prevent polluting the carrier during the process of cleaning the thin-film-deposition equipment.

20 Claims, 14 Drawing Sheets

SHIELDING DEVICE AND THIN-FILM-DEPOSITION EQUIPMENT WITH THE SAME

TECHNICAL FIELD

The present disclosure relates to a shielding device and a thin-film-deposition equipment with the same, which mainly employs the shielding device to cover a substrate carrier, in order to prevent polluting the carrier during a process of cleaning the reaction chamber.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner-edge surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the thin-film-deposition equipment is required for cleaning, in order to remove the waste thin film within the chamber and the oxide or nitride on the target material. During the cleaning process, some removed pollutant particles may turn to pollute the substrate carrier, thus there is a need to keep out the substrate carrier from the removed pollutant. The present disclosure provides a shielding device and a thin-film-deposition equipment with the same, which mainly employs a driver to rotate and swing two shield members in opposite angular directions to approach or leave each other, such that to operate between a shielding state and an open state. Thereby, the shield members in shielding state can cover and shield the substrate carrier, to prevent the removed pollutant particles from turning to pollute the substrate carrier during the process of cleaning the chamber or the target material.

An object of the present disclosure is to provide a thin-film-deposition equipment with shielding device, which includes a reaction chamber, a substrate carrier and a shielding device. The shielding device includes a driver, two carry arms and two shield members, wherein the driver interconnects and swings the shield members to move in opposite angular directions, such that to operate the shield members between an open state and a shielding state.

During a process of cleaning the reaction chamber, the driver swings the two shield members to approach each other, such that the two shield members come together to cover the substrate carrier within a containing space, in order to prevent a plasma employed to proceed the cleaning or some removed waste pollutant from turning to pollute the substrate carrier and/or the substrate thereon. Alternatively, during a process of performing the deposition, the driver swings the two shielding members to leave each other, such that to permit the process to proceed on the substrate within the reaction chamber.

Furthermore, the two shield members are placed on the carry arms and overlap each other, such that to form a whole shield for a full coverage of the carrier against the pollutants. Moreover, the shield members overlap however do not contact each other, such that to prevent a collision or friction therebetween and creating wear-off particles to further pollute the reaction chamber.

An object of the present disclosure is to provide a thin-film-deposition equipment with shielding device, which employs two shield members that can combine to form a whole shield, thereby to improve space efficiency. In one embodiment, the two shield members sway in opposite angular directions within the containing space of the reaction chamber, wherein the two are operable between an open state and a shielding state within the reaction chamber, such that to improve space efficiency of the reaction chamber.

An object of the present disclosure is to provide a thin-film-deposition equipment with shielding device, wherein the driver interconnects the two shield members via two carry arms, each of the carry arms sustains a behalf of the shield member. Moreover, the two carry arms may be configured to sustain thicker shield members, which are durable against deformation caused by high temperature, for better performance of the shield members.

To achieve the abovementioned object, the present disclosure provides a thin-film-deposition equipment, which includes a reaction chamber that has a carrier within the containing space for carrying at least one substrate; and a shielding device. The shielding device includes: a first-carry arm disposed within the containing space and having a plurality of first-positioning slots; a second-carry arm disposed within the containing space and having a plurality of second slots; a first-shield member having a surface formed with a plurality of first pins, wherein the first-shield member is placed on the first-carry arm with the first pins inside of the first-positioning slots; a second-shield member having a surface formed with a plurality of second pins, wherein the second-shield member is placed on the second-carry arm with the second pins inside of the second slots; a driver interconnecting the first-shield member and the second-shield member respectively via the first-carry arm and the second-carry arm, for swinging the first-shield member and the second-shield member in opposite directions, such that the first-shield member and the second-shield member are switchable between an open state and a shielding state, the first-shield member and the second-shield member are for covering the carrier.

The present disclosure also provides a shielding device, which is adapted to thin-film-deposition equipment, and includes: a first-carry arm disposed within the containing space and having a plurality of first-positioning slots; a second-carry arm disposed within the containing space and having a plurality of second slots; a first-shield member having a surface formed with a plurality of first pins, wherein the first-shield member is placed on the first-carry arm with the first pins inside of the first-positioning slots; a second-shield member having a surface formed with a plurality of second pins, wherein the second-shield member is placed on the second-carry arm with the second pins inside of the second slots; a driver interconnecting the first-shield member and the second-shield member respectively via the first-carry arm and the second-carry arm, for swinging the first-shield member and the second-shield member in opposite directions, such that the first-shield member and the second-shield member are switchable between an open state and a shielding state, wherein in the open state, the first-shield member and the second-shield member have an open space therebetween.

Another object of the present disclosure is to provide the abovementioned Shielding device and thin-film-deposition equipment, wherein each of the two shield members has a surface facing each other and respectively disposed with a cavity and a protrusion. The driver drives and swings the two shield members to approach each other, wherein the protrusion on one of the shield member is inserted into the cavity on another one of the shield member, such that the two shield members form a whole shield.

To achieve the abovementioned object, the present disclosure provides the aforementioned shielding device, wherein: the first-shield member includes a first-inner-edge surface formed with at least one protrusion; the second-shield member includes a second-inner-edge surface formed with at least one cavity corresponding to the protrusion of the first-inner-edge surface.

Another object of the present disclosure is to provide the abovementioned shielding device and thin-film-deposition equipment, wherein the shielding device further includes two guard plates, for guarding the shield members from damage caused by high-temperature matters or the heat itself.

To achieve the abovementioned object, the present disclosure provides the aforementioned shielding device, which includes a first-guard plate disposed on a surface of the first-shield member; and a second-guard plate disposed a surface of the second-shield member, wherein the first-guard plate and the second-guard plate also can approach each other to cover the first-shield member and the second-shield member together.

Another object of the present disclosure is to provide the abovementioned shielding device and thin-film-deposition equipment, wherein the shielding device includes two drivers respectively connected to the two shield members.

To achieve the abovementioned object, the present disclosure provides the aforementioned shielding device, wherein the driver includes: a first driver connected to the first-shield member; and a second driver connected to the second-shield member, wherein the first driver and the second driver respectively drive and swing the first-shield member and the second-shield member in the opposite directions, thereby the first-shield member and the second-shield member are switchable between the open state and the open state.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
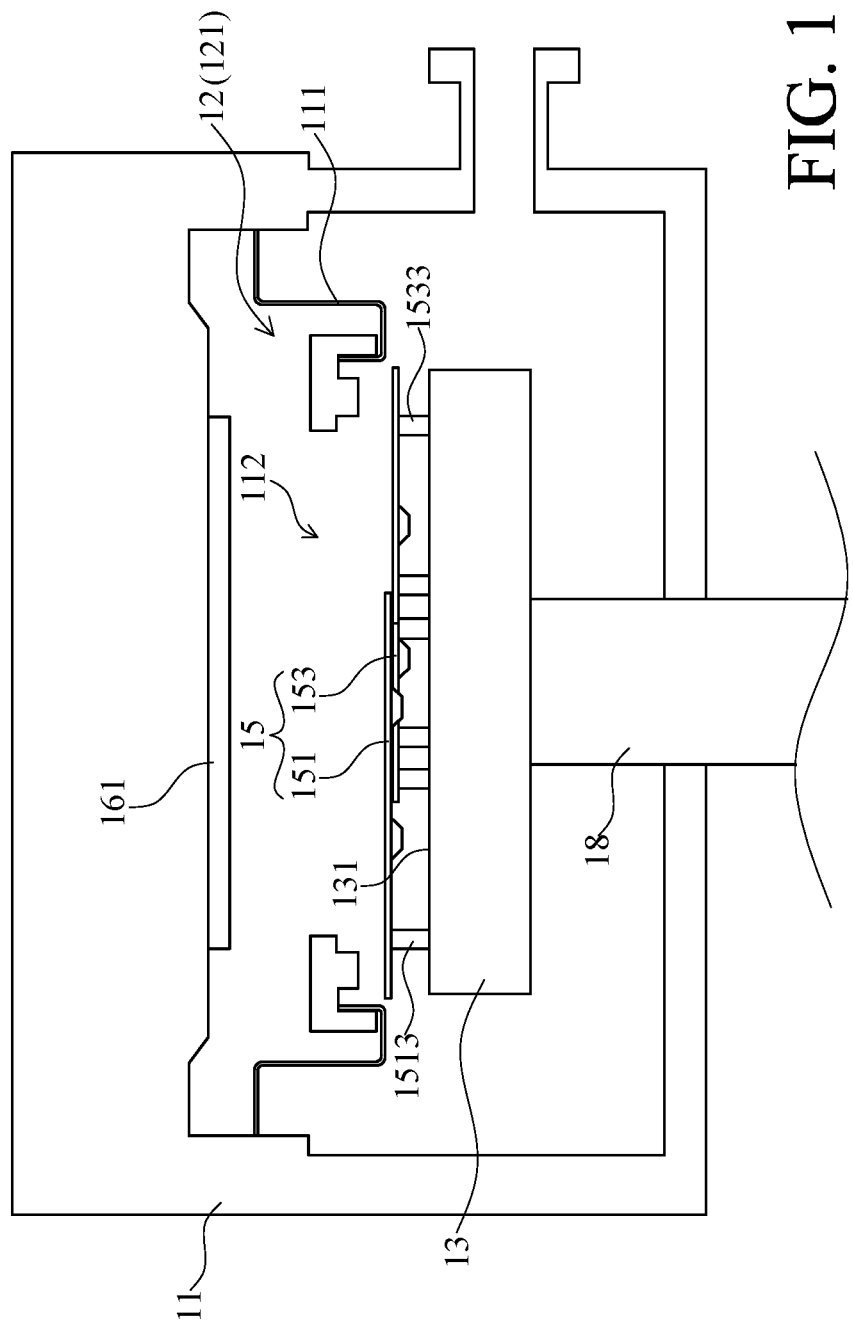
FIG. 1 is a schematic sectional view illustrating a shielding device of a thin-film-deposition equipment which is operated in a shielding state, according to one embodiment of the present disclosure.

Referring to FIG. 1, which is a schematic sectional view illustrating a shielding device 100 of a thin-film-deposition equipment 10 which is operated in a shielding state, according to one embodiment of the present disclosure. As shown in the FIG, the thin-film-deposition equipment 10 main includes a reaction chamber 11, a carrier 13 and a shielding device 100, wherein the reaction chamber 11 includes a containing space 12 for containing the carrier 13 and a portion of the shielding device 100.

The carrier 13 is positioned within the containing space 12 of the reaction chamber 11, for carrying at least one substrate (not shown). In this embodiment, the thin-film-deposition equipment 10 is exemplified as a physical-vapor deposition chamber. The reaction chamber 11 is disposed within a target material 161 and has the target material 161 facing the carrier 13. Specifically, the target material 161 may be disposed on a ceiling surface of the reaction chamber 11 to face the carrier 13 and/or the substrate carried thereon within the containing space 12, for example.

Figure 2:
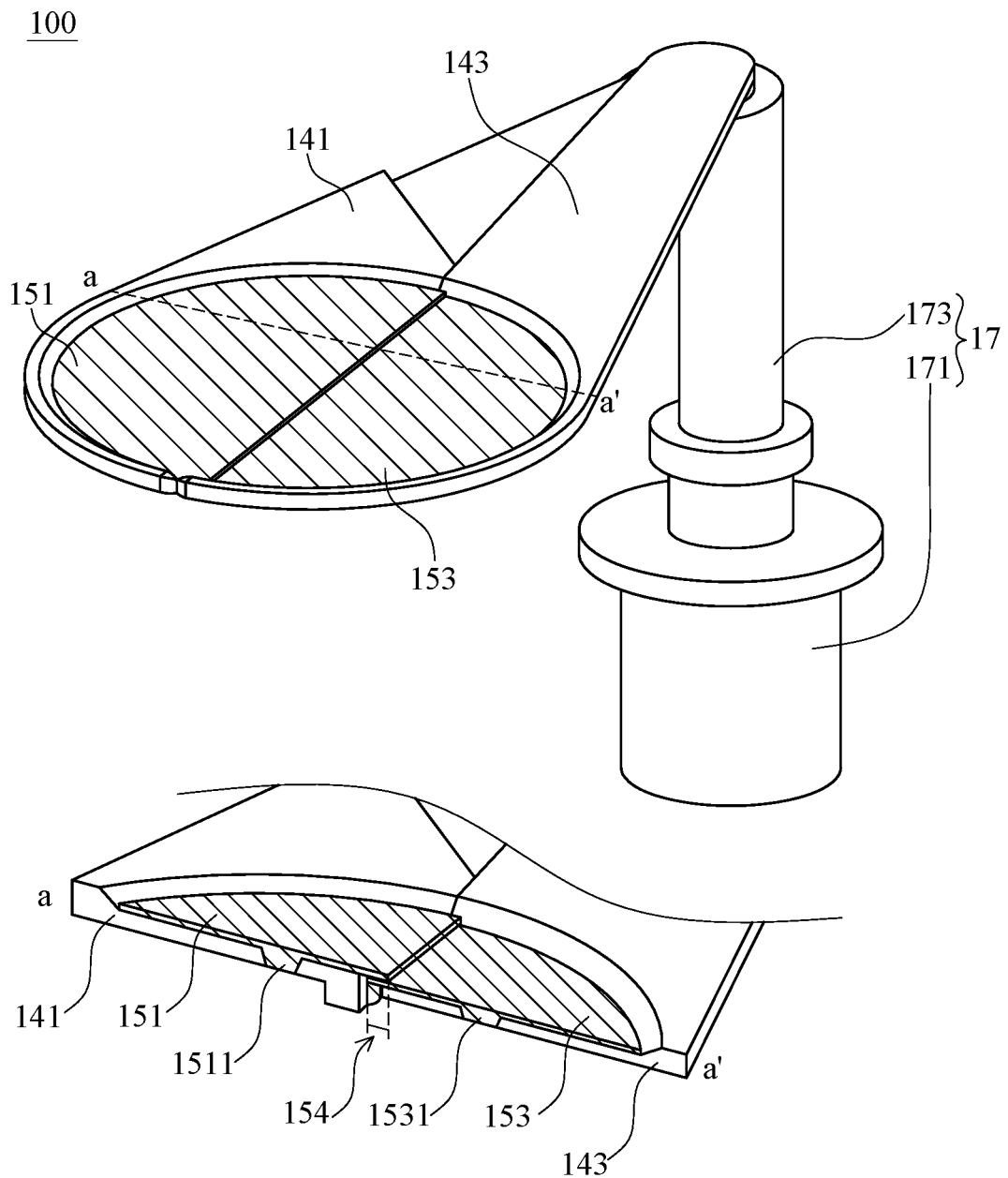
FIG. 2 is a schematic perspective view illustrating the shielding device which is operated in the shielding state, with a cross-sectional view taken along a line aa', according to one embodiment of the present disclosure.
Figure 3:
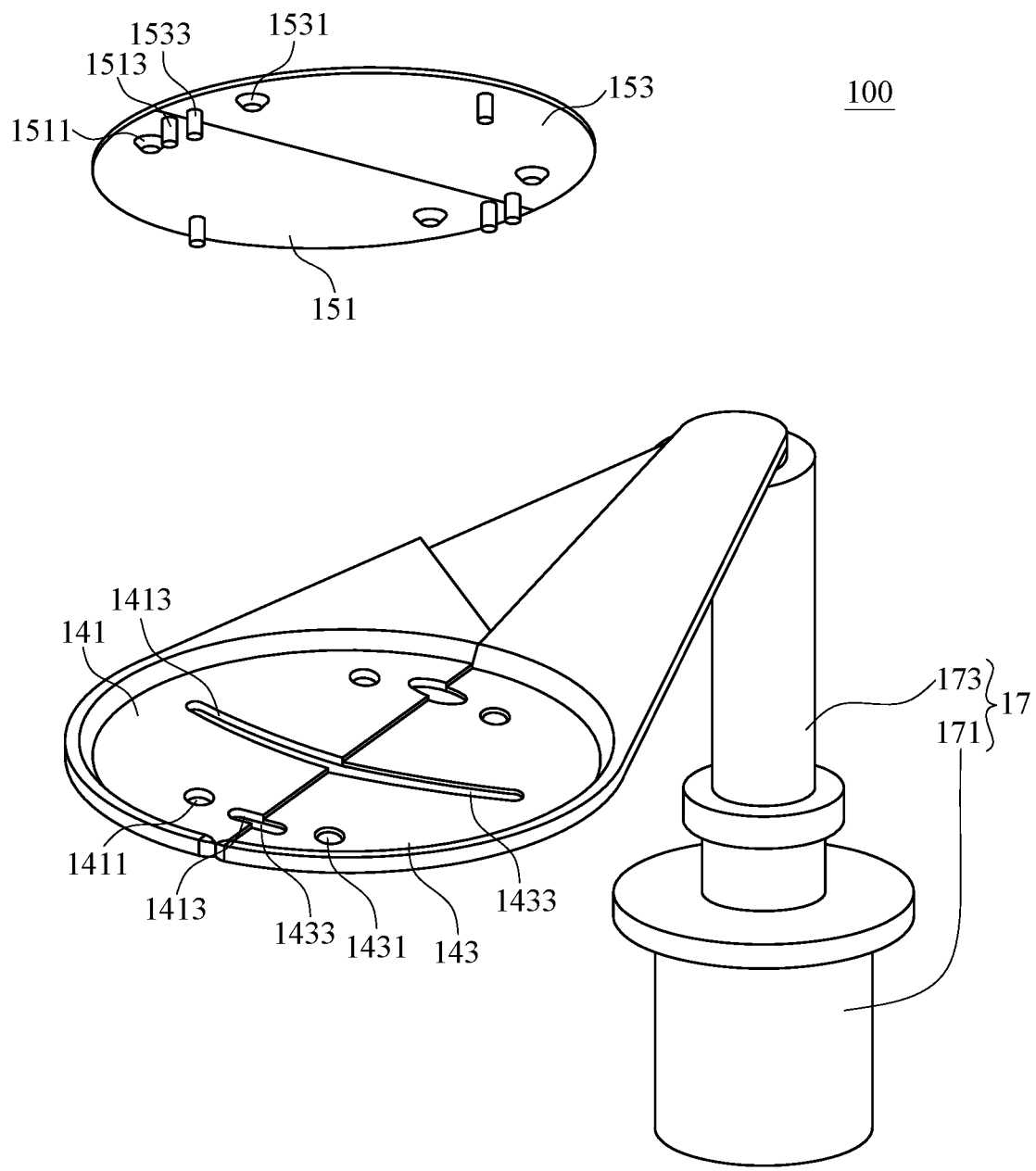
FIG. 3 is a schematic perspective exploded view illustrating the shielding device which is operated in the shielding state, according to one embodiment of the present disclosure.

Referring to FIG. 2 and FIG. 3, the shielding device 100 includes a first-carry arm 141, a second-carry arm 143, a first-shield member 151 and a second-shield member 153 and a driver 17, wherein the first-carry arm 141, the second-carry arm 143, the first-shield member 151 and the second-shield member 153 are positioned within the containing space 12. The driver 17 interconnects the first-carry arm 141 and the second-carry arm 143, wherein the first-carry arm 141 and the second-carry arm 143 are for respectively carrying the first-shield member 151 and the second-shield member 153. With such structure, the driver 17 drives, swings the first-shield member 151 and the second-shield member 153 in opposite angular directions via the first-carry arm 141 and the second-carry arm 143, such as to have the first-shield member 151 and the second-shield member 153 swaying toward or away from each other synchronously, about an axle of the driver 17.

The first-shield member 151 has a surface (downside of FIG. 3) that is connected to the first-carry arm 141, and that may be disposed with at least one first pin 1513 and/or at least one first-shield aligner 1511 (all plural in this embodiment). In the other hand, the first-carry arm 141 also has a surface (upside of FIG. 3) that is connected to the first-shield member 151, and that may be disposed with at least one first-positioning slot 1413 and/or at least one first-arm aligner 1411 (all plural in this embodiment). When the first-shield member 151 is placed on the first-carry arm 141, the first pins 1513 and the first-shield aligners 1511 thereof are respectively contained within the first-positioning slots 1413 and the first-arm aligners 1411.

The second-shield member 153 has a surface (downside of FIG. 3) which is connected to the second-carry arm 143, and which may be disposed with at least one second pins 1533 and/or at least one second-shield aligner 1531 (all plural in this embodiment). In the other hand, the second-carry arm 143 has a surface (upside of FIG. 3) which is connected to the second-shield member 153, and which may be disposed with at least one second-positioning slot 1433 and/or at least one second-arm aligner 1431 (all plural in this embodiment), wherein the second-positioning slots 1433 and the second-arm aligners 1431 respectively correspond and contain the second pins 1533 and the second-shield aligners 1531

To be specific, the first-shield aligners 1511 on the first-shield member 151 and the first-arm aligners 1411 on the first-carry arm 141 may be corresponding structures, for aligning the first-shield member 151 and the first-carry arm 141. In the other hand, the second-shield aligners 1531 of the second-shield member 153 and the second-arm aligners 1431 of the second-carry arm 143 may be corresponding structures. In more detail, the first-shield aligners 1511 and the second-shield aligners 1531 may be conical structures respectively protruding from the surface of the first-shield member 151 and the surface of the second-shield member 153, wherein the shield aligners 1511, 1531 are formed with larger cross-sections on the surfaces of the shield members 151, 153 and taper narrower to the protruding ends thereof. In the other hand, the first-arm aligner 1411 and the second-arm aligner 1431 may be conical cavities or holes formed on the surfaces of the first-carry arm 141 and the second-carry arm 143, wherein the arm aligners 1411, 1431 are also formed larger on the surfaces of the carry arms 141, 143 and taper narrower into the carry arms 141, 143. Also to mention, the first pin 1513 and the second pins 1533 may be cylindrical structures disposed on the surface of the first-shield member 151 and the surface of the second-shield member 153.

When the first-shield member 151 and the second-shield member 153 are respectively placed on the first-carry arm 141 and the second-carry arm 143, as the first-shield aligner 1511 and the second-shield aligner 1531 respectively engage with the first-arm aligner 1411 and the second-arm aligner 1431, the shield members 151, 153 are held and positioned on the carry arms 141, 143. However it should be noted, the protruding shield aligners 1511, 1531 and the concave arm aligners 1411, 1431 are merely one embodiment of the present disclosure, in a different embodiment, the shield aligners may be configured as cavities, and the concave arm aligners may be protrusions, in an alternative manner.

Figure 4:
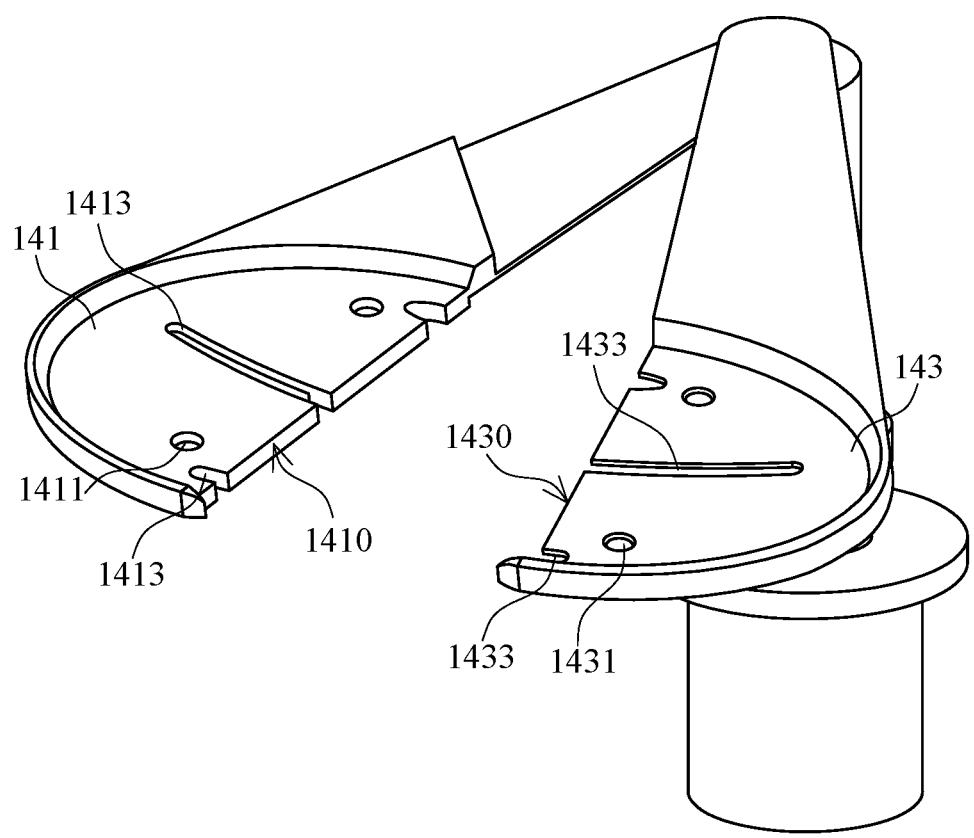
FIG. 4 is a schematic perspective view illustrating the shielding device which is operated in an open state omitting a first-shield member and a second-shield member, according to one embodiment of the present disclosure.

As shown in FIG. 4, the first-carry arm 141 includes a first-inner-edge surface 1410, the second-carry arm 143 includes a second-inner-edge surface 1430, wherein the first-inner-edge surface 1410 of the first-carry arm 141 faces the second-inner-edge surface 1430 of the second-carry arm 143. The first-positioning slots 1413 are formed as notches opened on the first-inner-edge surface 1410, and the second-positioning slots 1433 are formed as notches opened on the second-inner-edge surface 1430.

Moreover, the shield members 151, 153 are removable and separable from the carry arms 141, 143, to be placed on a carry surface the carrier 13 which is for carrying the substrate.

The first-shield member 151 and the second-shield member 153 may be formed as plates with similar shapes, such as respectively formed as one half and another half of a round plate. Such that, as the driver 17 swings the first-carry arm 141 and the second-carry arm 143 to respectively move the first-shield member 151 and the second-shield member 153 toward each other, the two members 151, 153 come together and form a whole round shield 15, for covering and shielding the carrier 13 and/or the substrate thereon.

In more detail, as shown in FIG. 1, when the first-carry arm 141 and the second-carry arm 143 are driven by the driver 17 to move the first-shield member 151 and the second-shield member 153 approaching each other and forming the whole shield 15, an elevating unit 18 may be employed to move the carrier 13 toward the target material 161, such that the carry surface 131 of the carrier 13 contact the first pin 1513 and the second pin 1533 to push up the first-shield member 151 and the second-shield member 153, and thereby to disengage the shield aligners 1511, 1533 and the arm aligners 1411, 1431. Thereafter, the two carry-arms 141, 143 are driven to leave each other, meanwhile, the first pins 1513 of the first-shield member 151 is out of the first-positioning slots 1413 from the first-inner-edge surface 1410 of the first-carry arm 141, and the second pins 1533 of the second-shield member 153 is out of the second-positioning slots 1433 from the second-inner-edge surface 1430 of the second-carry arm 143, such that the two carry arms 141, 143 leave the two shield members 151, 153 standing on the carry surface 131 of the carrier 13 by the pins 1513, 1533.

However, the two carry arms 141, 143 leaving the two shield members 151, 153 to stand on the carry surface 131 of the carrier 13 by the pins 1513, 1533, which is merely one embodiment of the present disclosure, in a different embodiment, the two carry arms may hold still in positions when two shield members come together and stand on the carry surface of the carrier.

In this embodiment, the first-shield member 151 and the second-shield member 153 can be operated to move into a shielding state, which is defined as the first-shield member 151 and the second-shield member 153 continue to approach each other, until a distance between the two members 151, 153 is less than a threshold value, such as 1 millimeter (mm), then be placed on the carry surface 131 of the carrier 13. To be specific, the first-shield member 151 and the second-shield member 153 do not actually contact each other, such that to avoid a collision or friction therebetween, which may create some wear-off particles therefrom to pollute the containing space 12 of the reaction chamber 11 and/or the carrier 13 therein.

However, with the abovementioned structure, a gap space (similar to a gap space 254 in FIG. 11) remains between the first-shield member 151 and the second-shield member 153, which may still allow a plasma or pollutants created during a cleaning process to pass and then to pollute the carrier 13 and/or the substrate thereon, during the cleaning process. Therefore, in one embodiment of the present disclosure, the first-shield member 151 and the second-shield member 153 may be disposed in different heights, such as to have the first-shield member 151 positioned higher than the second-shield member 153. With such configuration, when the first-shield member 151 and the second-shield member 153 are operated to move into the shielding state, the two shield members 151, 153 can partially overlap for a full coverage.

The first-shield member 151 and the second-shield member 153 formed with similar, half-round shapes and area sizes, which is merely one embodiment of the present disclosure, therefore claim scope of the present disclosure is not limited thereto. In practical use, the first-shield member 151 and the second-shield member 153 may be formed with different area sizes and shapes, such rectangular plates, ellipse plates or plates in any other geometric shape, moreover, the first-shield member 151 may have an area size larger than that of the second-shield member 153. What is essential for the claim scope of the present disclosure is that, two shield members which can approach each other to form a whole shield for covering the carrier and/or substrate thereon.

Figure 10:
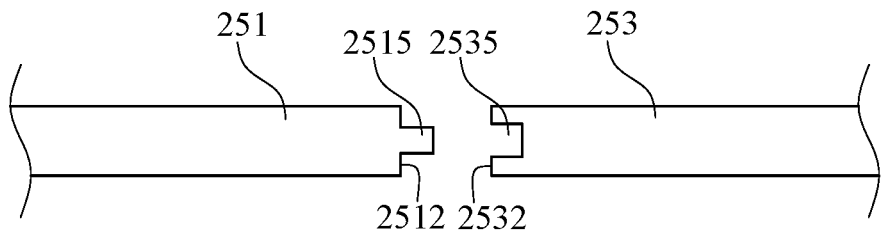
FIG. 10 is a schematic fragmentary sectional view illustrating the first-shield member and the second-shield member of the shielding device which are separate from each other, according to another embodiment of the present disclosure.

For this embodiment, the first-shield member 151 and the second-shield member 153 are both formed as half-round plates, each of the shield member 151, 153 is formed with a straight, flat inner-edge surface (similar to a first-inner-edge surface 2512 and a second-inner-edge surface 2532 in an embodiment of FIG. 10), and also formed with a curved outer-edge surface (similar to a first-outer-edge surface 2534 and a second-outer-edge surface 2534 in the embodiment of FIG. 10). Moreover, the inner-edge surface of the first-shield member 151 and the inner-edge surface of the second-shield member 153 correspond to each other. When the driver 17 drives and swings the carry arms 141, 143 to move the first-shield member 151 and the second-shield member 153 toward each other, the two shield members 151, 153 then come together and form the whole round shield 15, also to have the two inner-edge surfaces thereof facing each other. However, the claim scope of the present disclosure is not limited to such straight and flat inner-edge surfaces of the shield members 151, 253, in practical use, the inner-edge surfaces may be formed in concave and convex shapes or zig-zag shapes corresponding to each other, it is only sufficient to have the inner-edge surfaces of the two shield members to approach and be adjacent to each other, for effectively cover the carrier 13.

Moreover, in a different embodiment of the present disclosure, the inner-edge surface of the first-shield member 151 may be configured to incline related to a top surface (upside of FIG. 2) or a bottom surface (downside of FIG. 2, disposed with the first pins 1511 and the first-shield aligners 1513) of the first-shield member 151. In the other hand, the inner-edge surface of the second-shield member 153 may also be configured to incline related to a top surface (upside of FIG. 2) or a bottom surface (downside of FIG. 2, disposed with the second pins 1531 and the second-shield aligners 1533) of the second-shield member 153. Also, the inner-edge surface of the first-shield member 151 and the inner-edge surface of the first-shield member 151 are formed substantially parallel and corresponding to each other, such that when the two shield members 151, 153 are in the shielding state, the gap space is formed in an inclined manner, which can be effective for blocking the pollutants falling vertically downward.

Figure 5:
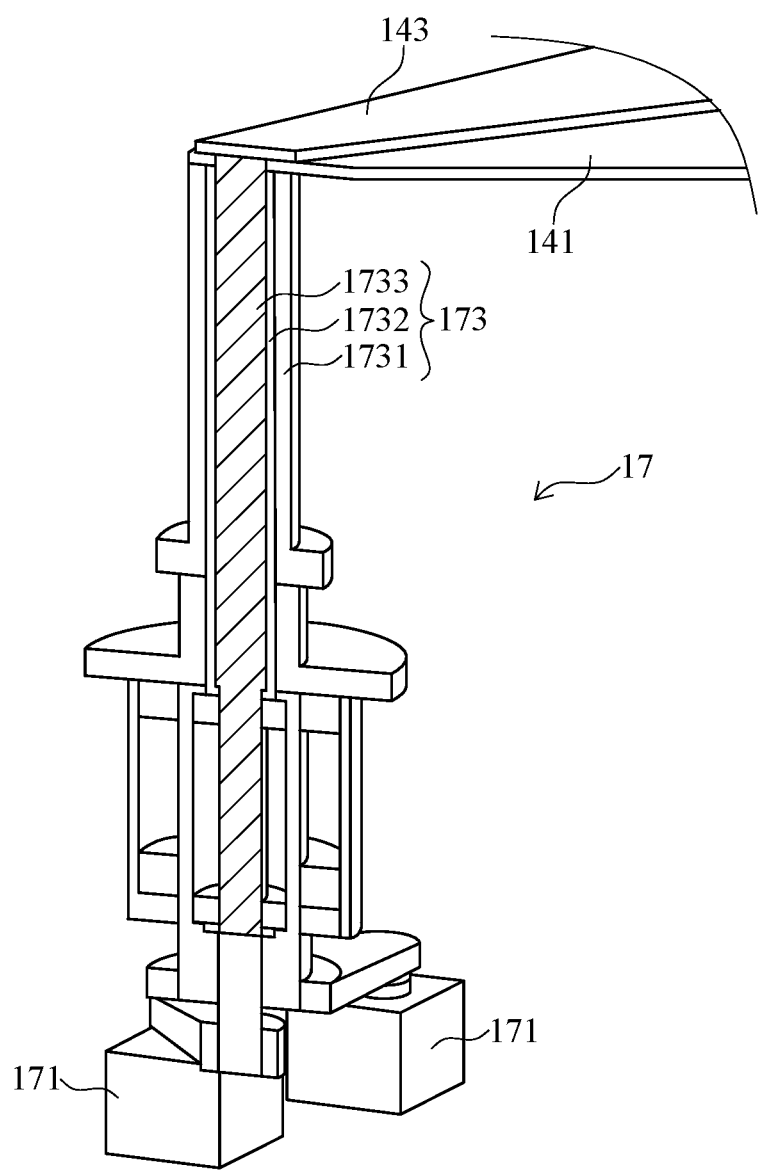
FIG. 5 is a schematic perspective sectional view illustrating a driver of the shielding device, according to one embodiment of the present disclosure.

In one embodiment of the present disclosure as shown in FIG. 5, the driver 17 includes at least one motor 171 and a shaft seal 173, wherein the motor 171 is connected to the first-shield member 151 and the second-shield member 153 via the shaft seal 173. The motor 171 is positioned outside of the containing space 12 within the reaction chamber 11. The shaft seal 173 extends from the motor 171 and into the reaction chamber 11, and hence partially disposed within the containing space 12.

Specifically, the shaft seal 173 includes an outer tube 1731 and a main shaft 1733. The outer tube 1731 has an inner space 1732 for containing the main shaft 1733, wherein the outer tube 1731 and the main shaft 1733 are disposed concentrically. Moreover, the outer tube 1731 and the main shaft 1733 can be driven by the motor 171 to rotate relative to each other. The outer tube 1731 is connected to the first-carry arm 141, and such that able to swing the first-carry arm 141 to hence move the first-shield member 151. The main shaft 1733 is connected to the second-carry arm 143, and such that able to swing the second-carry arm 143 to hence move the second-shield member 153.

The shaft seal 173 may be a common shaft seal component, which is mainly for isolating the containing space 12 of the reaction chamber 11 from an outside thereof and maintaining a vacuum condition within the containing space 12. In a different embodiment of the present disclosure, the shaft seal 173 may be a magnetic liquid rotary sealing, which includes a plurality of bearings, at least one permanent magnet, at least one pole piece and at least one ferrofluid.

In one embodiment of the present disclosure as shown in FIG. 5, the motor 171 may be two respectively connected to the outer tube 1731 and the main shaft 1733 of the shaft seal 173, to drive the outer tube 1731 and the main shaft 1733 to rotate in opposite directions, such that to swing and move the first-shield member 151 and the second-shield member 153 in the opposite directions via the outer tube 1731 and the main shaft 1733.

In a different embodiment of the present disclosure, the motor 171 may be just one with a drive mechanism (e.g. gear system or linkage system, etc.), such that to drive, swing the first-carry arm 141 and the second-carry arm 143 and to further move the first-shield member 151 and the second-shield member 153 in the opposite directions.

Figure 6:
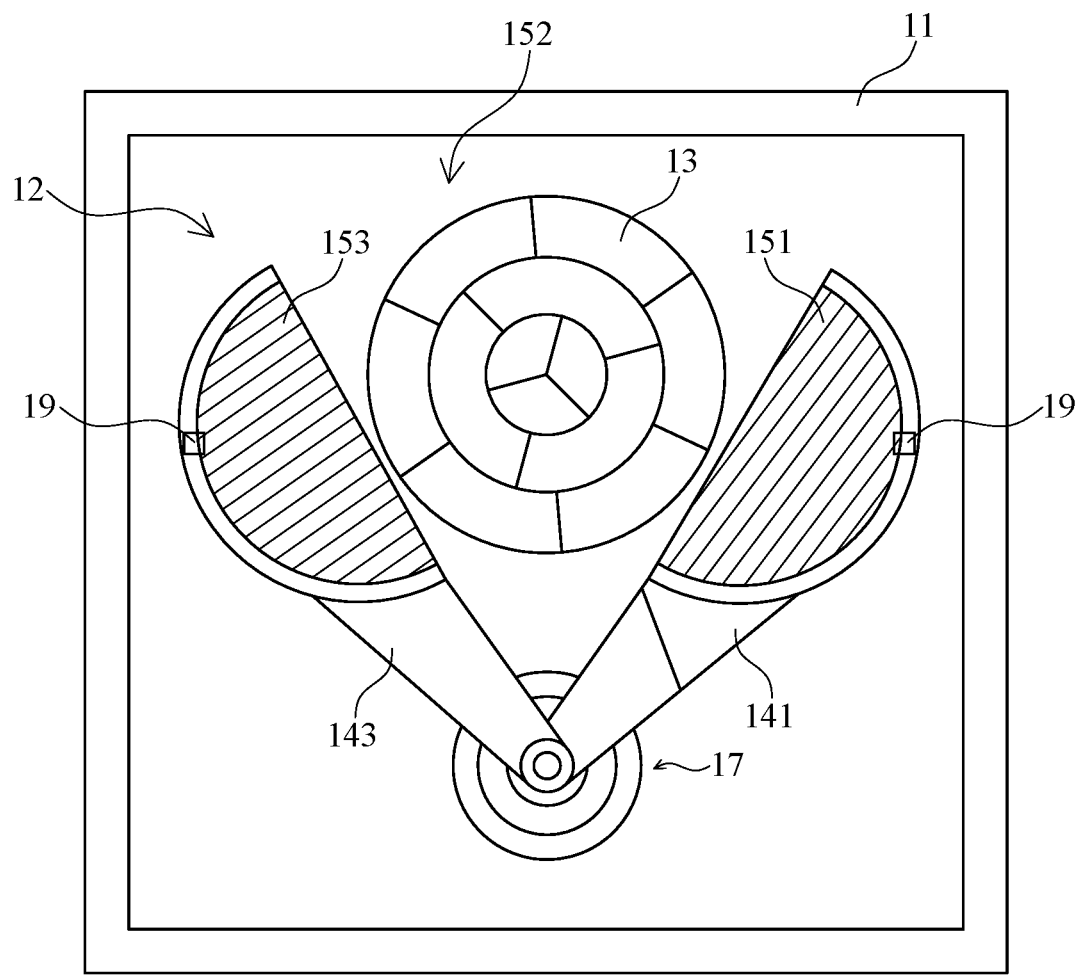
FIG. 6 is a schematic top view illustrating the shielding device of the thin-film-deposition equipment which in the open state, according to one embodiment of the present disclosure.

In more detail, Thin-film-deposition equipment 10 and/or the shielding device 100 according to the present disclosure, which can be operated to switch between two states as an open state and a shielding state. As shown in FIG. 6, the driver 17 can drive, swing the first-shield member 151 and the second-shield member 153 to move in the opposite directions, such that the first-shield member 151 and the second-shield member 153 leave each other and move into the open state. In the open state, the first-shield member 151 and the second-shield member 153 have an open space 152 therebetween, such that the first-shield member 151 and the second-shield member 153 do not get between the target material 161 and the carrier 13 with the substrate 163 thereon.

When the first-shield member 151 and the second-shield member 153 are operated into the open state, the carrier 13 can be driven by the elevating unit 18 to approach the target material 16. Thereafter, a process gas (e.g. noble gas) is employed to bombard the target material 16, in order to remove and deposit particles (e.g. atoms or molecules) of the target material 16 and form a thin film on a surface of the substrate carried on the carrier 13.

In a different embodiment of the present disclosure as shown in FIG. 1, the containing space 12 of the reaction chamber 11 may be disposed with a tubular blocking member 111, which has one end connected to the ceiling surface of the reaction chamber 11, and another end formed with an opening 112. Such that, when the carrier 13 approaches the target material 161, the carrier 13 also enters the opening 112 or contacts the blocking 111. The reaction chamber 11, the carrier 13 and the blocking member 111 together define a reactive space within the containing space 12, for forming the thin film on the substrate within the reactive space, such that to prevent the blew-off particles of the target material 161 from spreading out of the reactive space and forming undesired thin film outside.

Figure 7:
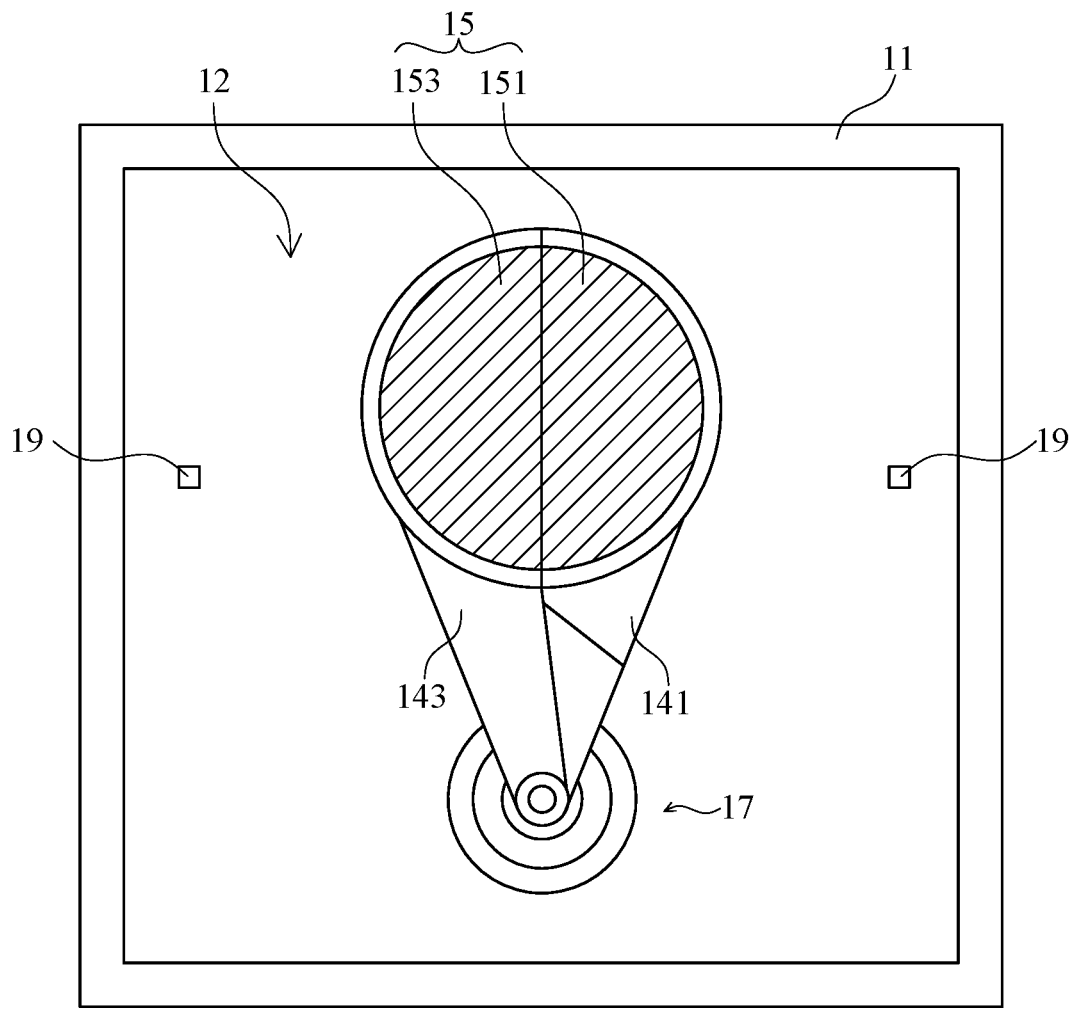
FIG. 7 is a schematic top view illustrating the shielding device of the thin-film-deposition equipment which is in the shielding state, according to one embodiment of the present disclosure.

In the opposite manner, as shown in FIG. 2 and FIG. 7, the driver 17 can drive, swing the first-shield member 151 and the second-shield member 153 to approach each other and move into the shielding state. In the shielding state, the first-shield member 151 and the second-shield member 153 come together and form the whole shield 15 between the target material 161 and the carrier 13, such that to cover and shield the carrier 13 from the target material 161.

As shown in FIG. 1, the shield 15 and the blocking member 111 together can define a cleaning space 121 within the containing space 12, wherein the cleaning space 121 and the aforementioned reactive space have partially or completely spatial overlap. A burn-in process may be performed within the cleaning space 121, to clean the target material 161, the ceiling surface of the reaction chamber 11 and/or an inside of the blocking member 111, and to remove oxides, nitrides or other pollutants on the target material 161, also to remove undesired, waste thin film within the reaction chamber 11 and/or the blocking member 111.

In one embodiment of the present disclosure as shown in FIG. 6 and FIG. 7, the reaction chamber 11 and/or the containing space 12 may be configured to have a relatively large size, which is sufficient for accommodating the two shield members 151, 153 in the open state, therefore no need of additional containers for storing the shield members 151, 153.

In one embodiment of the present disclosure, the reaction chamber 11 may be further disposed with a plurality of position sensors 19 (e.g. optical sensors) within the containing space 12, for respectively detecting locations the first-shield member 151 and the second-shield member 153. The position sensors 19 are configured to confirm that the first-shield member 151 and the second-shield member 153 are in the open state, thereby to avoid undesired interference, collisions between those movable components as the two carry arms 141, 143 and the two shield members 151, 152 and the carrier 13.

In practical use, according to how the other components, mechanisms and movements thereof in the thin-film-deposition equipment 10 are arranged, the shielding device 100 may be disposed at different locations within the reaction chamber 11. For this embodiment as shown in FIG. 6 and FIG. 7, as the containing space 12 of the reaction chamber 11 is substantially formed with a rectangular cross-section, the driver 17 of the shielding device 100 may be disposed at a side of the reaction chamber 11 and/or the containing space 12. Alternatively, in other embodiments (similar to an embodiment of FIG. 8), the driver 17 of the shielding device 100 may be disposed on or near by a corner of the reaction chamber 11 and/or the containing space 12, such that the reaction chamber 11 can be further disposed with substrate passages or gas-extraction pipelines (not shown) at lateral sides thereof.

Figure 8:
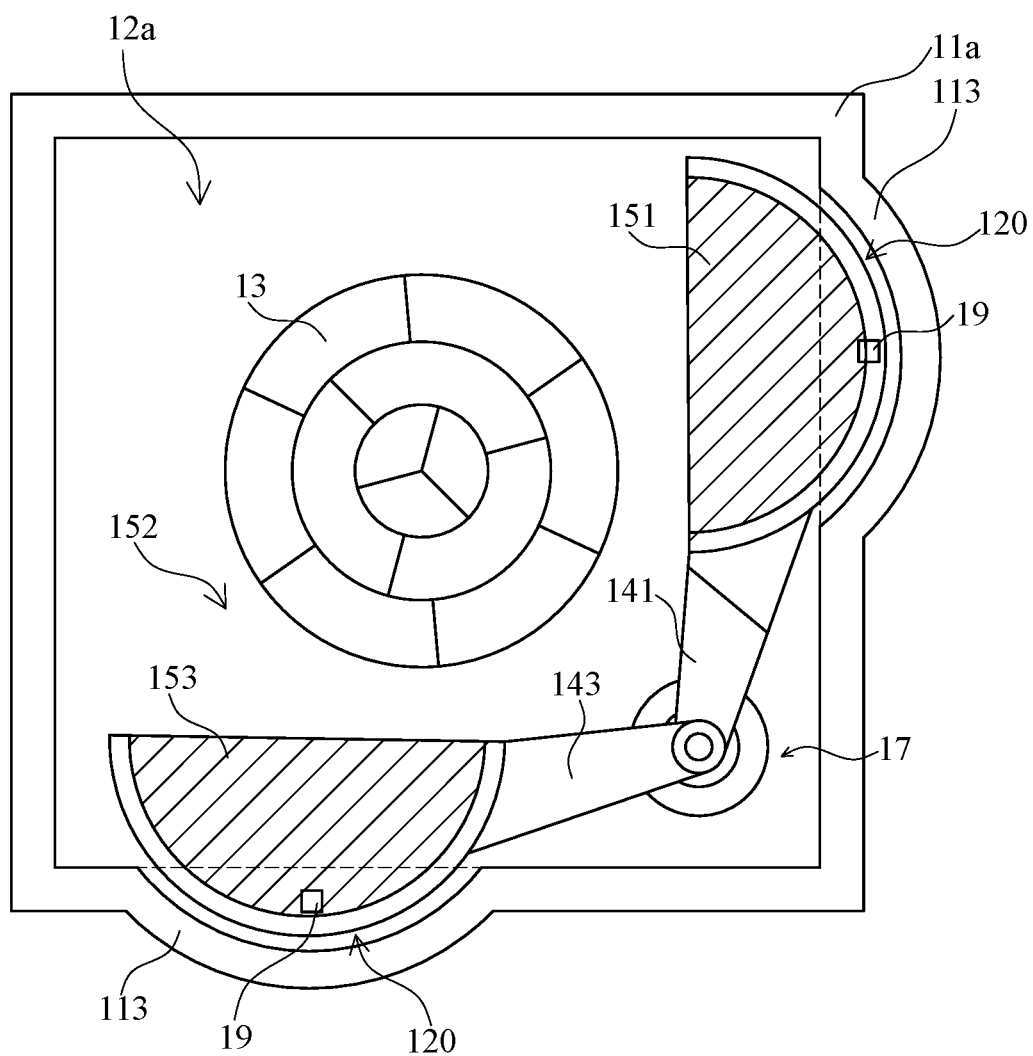
FIG. 8 is a schematic top view illustrating the shielding device of the thin-film-deposition equipment which in is the open state, according to a different embodiment of the present disclosure.

In the embodiment as shown in FIG. 8, the reaction chamber 11a may be respectively disposed with two sensor areas 113 which are respectively connected to two sides thereof, wherein each of the sensor areas 113 has a height shorter than that of the reaction chamber 11a. Furthermore, each of the sensor areas 113 is formed with a sensing space 120 therein which is spatially and fluidly connected to the containing space 12 of the reaction chamber 11a, for partially containing the first-shield member 151 and the second-shield member 153 respectively when the two shield members 151 are operated into the open state. Also to mention that when in the open state, each of the first-shield member 151 and the second-shield member 153 has a relatively small portion within the corresponding sensing space 120, and relatively large portion remaining within the containing space 12.

Moreover, each of the sensing spaces 120 of the sensor areas 113 are disposed with at least one position sensor 19, for respectively detecting and confirming that the two shield members 151, 153 have entered the sensing spaces 120 and in the open state. Also to mention that in this embodiment, the driver 17 is disposed on or near by a corner of the reaction chamber 11 and/or the containing space 12, and the two sensor areas 113 are respectively disposed on two adjacent sides of the reaction chamber 11, to facilitate disposing substrate passages or gas-extraction pipelines on the reaction chamber 11. However surely, in other different embodiment, the driver can be configured to dispose on a side of the reaction chamber 11 and/or the containing space 12, and the two sensor areas can be respectively disposed on two opposite sides of the reaction chamber 11.

Figure 9:
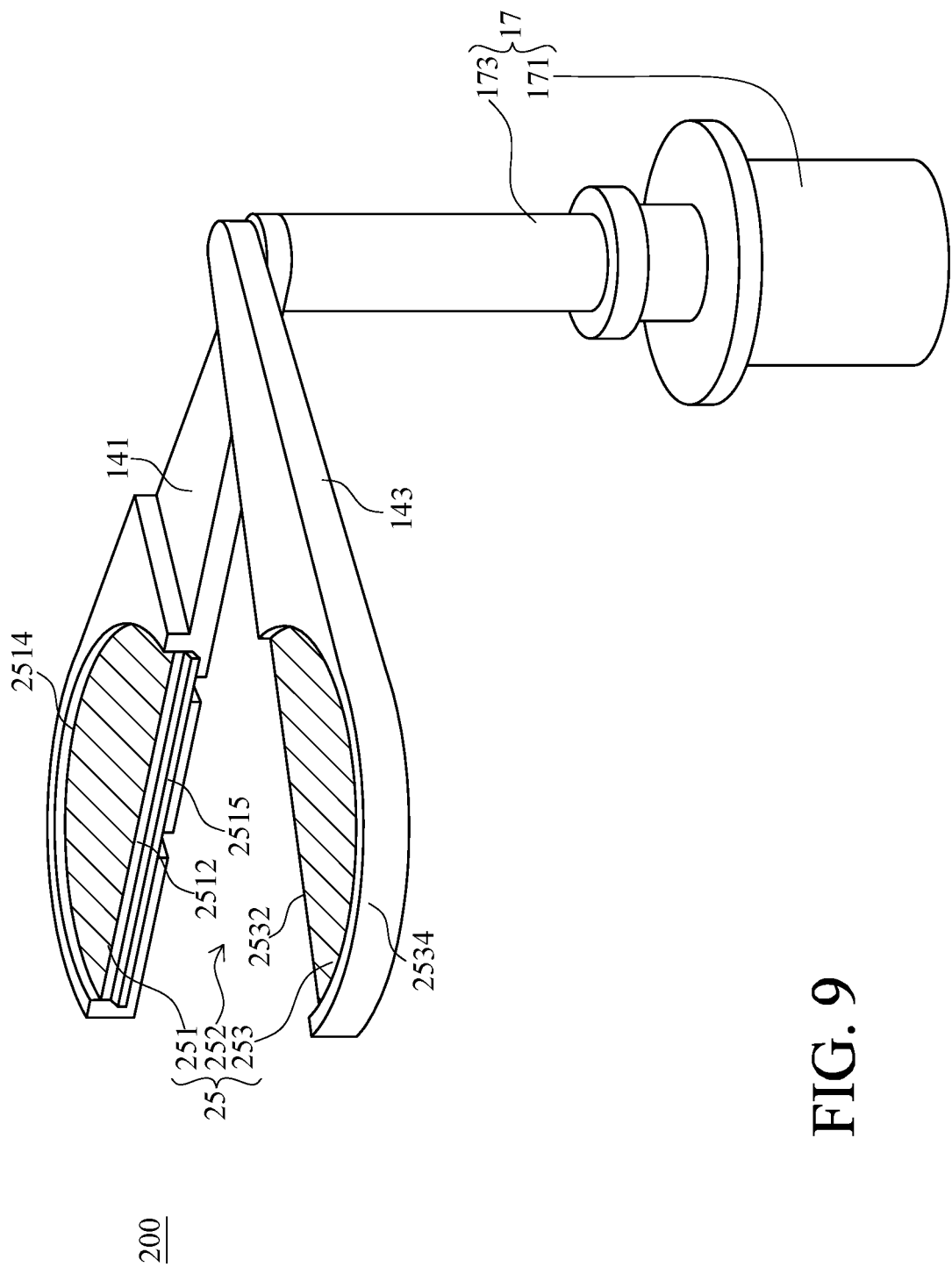
FIG. 9 is a schematic perspective view illustrating the shielding device of the thin-film-deposition equipment which is in the open state, according to another embodiment of the present disclosure.
Figure 11:
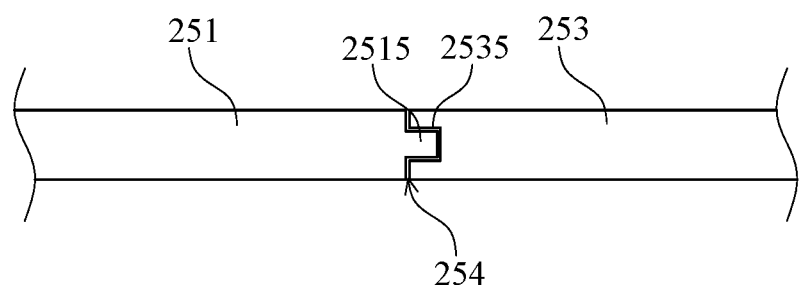
FIG. 11 is a schematic fragmentary sectional view illustrating the first-shield member and the second-shield member of the shielding device which are in the shielding state, according to another embodiment of the present disclosure.

Referring to FIG. 9~FIG. 11, wherein FIG. 9 is a schematic perspective view illustrating the shielding device 200 of the thin-film-deposition equipment which is in the open state, FIG. 10 is a schematic fragmentary sectional view illustrating the first-shield member 251 and the second-shield member 253 of the shielding device 200 which are separate from each other, and FIG. 11 is a schematic fragmentary sectional view illustrating the first-shield member 251 and the second-shield member 253 of the shielding device 200 which are in the shielding state, according to another embodiment of the present disclosure. The shielding device 200 in this embodiment is similar to that in aforementioned embodiments, but different in structures of the first-shield member 251 and the second-shield member 253. The first-shield member 251 has at least one protrusion 2515 formed on the first-inner-edge surface 2512, in the other hand, the second-shield member 253 has at least one cavity 2535 formed on the second-inner-edge surface 2532. Furthermore, the protrusion 2515 on the first-inner-edge surface 2512 corresponds to the cavity 2535 on the second-inner-edge surface 2532, and the protrusion 2515 is formed slightly smaller than the cavity 2535.

Figure 12:
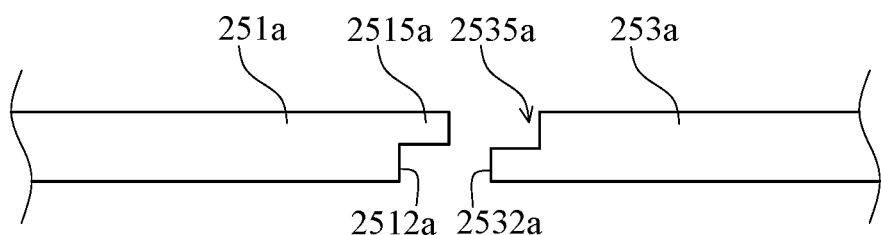
FIG. 12 is a schematic fragmentary sectional view illustrating the first-shield member and the second-shield member which are separate from each other, according to another different embodiment of the present disclosure.

As shown in FIG. 10 and FIG. 11, the protrusion 2515 is positioned at middle of the first-inner-edge surface 2512 on the first-shield member 251, the cavity 2535 is also positioned at middle of the second-inner-edge surface 2532 on the second-shield member 253. However, in another different embodiment as shown in FIG. 12, the protrusion 2515a may be positioned at an upper portion of the first-inner-edge surface 2512a of the first-shield member 251a, and the cavity 2535a may also be positioned at a upper portion of the second-inner-edge surface 2532a.

As shown in FIG. 11, in this embodiment, when the first-shield member 251 and the second-shield member 253 are operated in the shielding state, between the first-shield member 251 and the second-shield member 253, the first-inner-edge surface 2512 and the second-inner-edge surface 2532 are adjacent to each other and maintain the gap space 254, furthermore, the protrusion 2515 on the first-inner-edge surface 2512 enters the cavity 2535 on the second-inner-edge surface 2532 but still maintain the gap space 254 therebetween.

Similar to the aforementioned embodiment, the gap space 254 between the first-inner-edge surface 2512 and the second-inner-edge surface 2532 is configured less than the aforementioned threshold value, such as 1 mm. Thereby, the first-shield member 251 and the second-shield member 253 do not contact each other, nor the protrusion 2515 and the cavity 2535 thereon, in order prevent the collision or friction therebetween.

Also, similar to the aforementioned embodiment, the first-shield member 251 and the second-shield member 253 are formed as half-round plates, with straight and flat inner-edge surfaces 2512, 2532. However, the present disclosure is mot limited thereto, in other embodiment, the inner-edge surfaces may be formed in concave and convex shapes or zig-zag shapes, or even inclined planes but still corresponding to each other.

Figure 13:
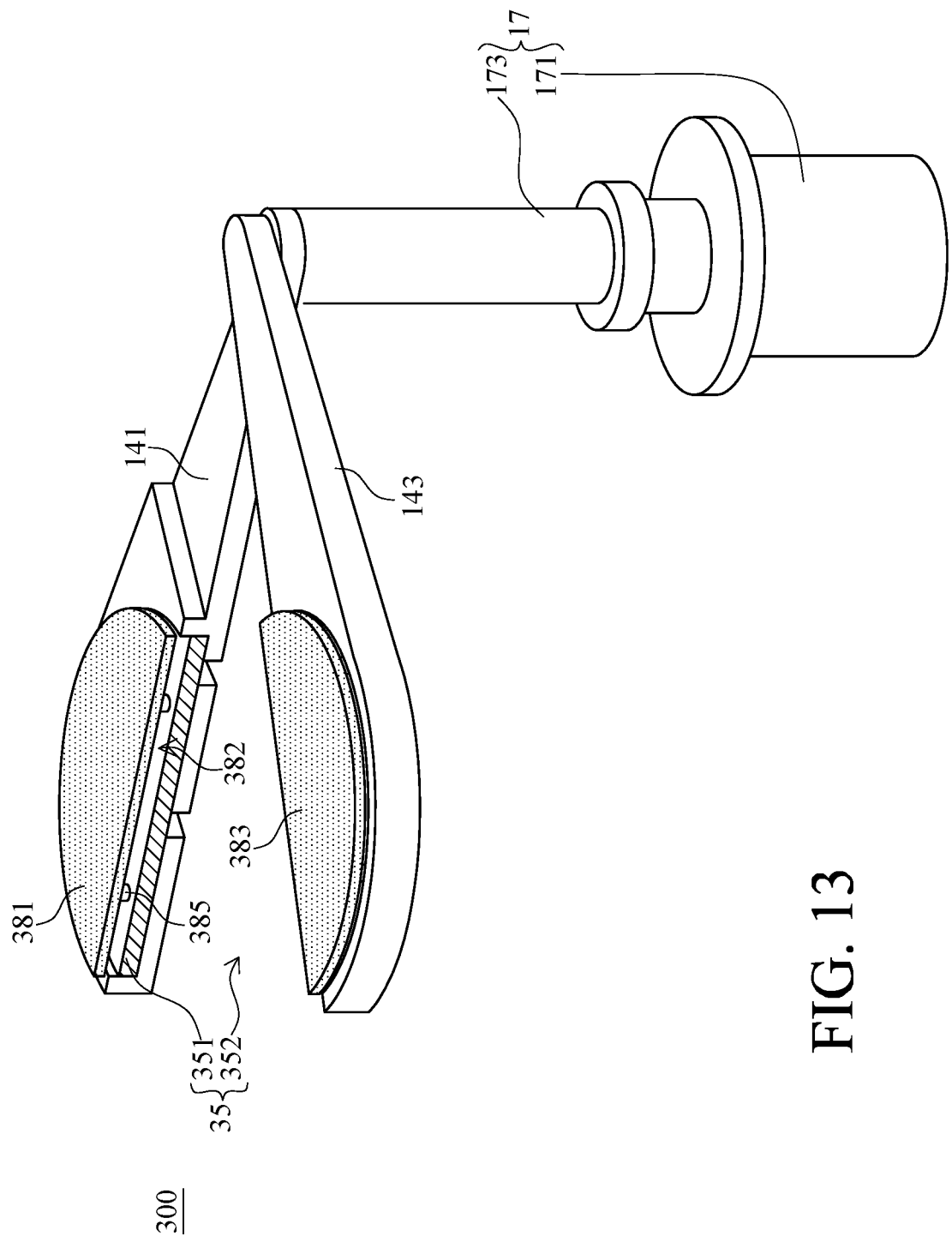
FIG. 13 is a schematic perspective view illustrating the shielding device of the thin-film-deposition equipment which is in the open state, according to yet another embodiment of the present disclosure.
Figure 14:
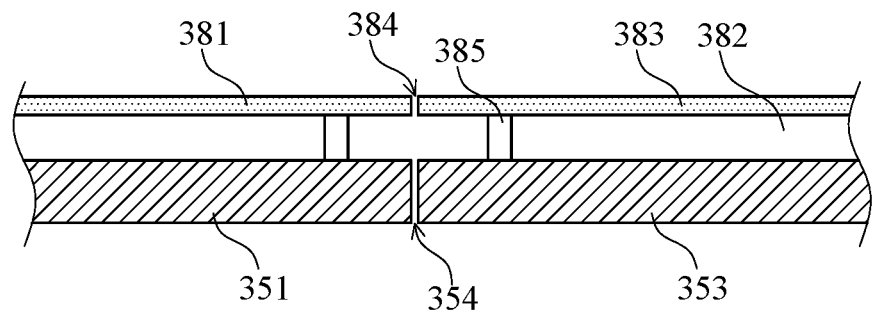
FIG. 14 is a schematic fragmentary sectional view illustrating the first-shield member and the second-shield member of the shielding device which are in the shielding state, according to yet another embodiment of the present disclosure.

Referring to FIG. 13 and FIG. 14, wherein FIG. 13 is a schematic perspective view illustrating the shielding device of the thin-film-deposition equipment which is in the open state, and FIG. 14 is a schematic fragmentary sectional view illustrating the first-shield member and the second-shield member of the shielding device which are in the shielding state, according to yet another embodiment of the present disclosure. In comparison with the aforementioned embodiments, the shielding device 300 in this embodiment, which includes a first-guard plate 381 and a second-guard plate 383 respectively disposed on the top surfaces of the first-shield member 351 and the second-shield member 353. With such structure, as the driver 17 drives, swings the carry arms 341, 343 to move second-shield members 351, 353 toward each other into the shielding state, the first-guard plate 381 and the second-guard plate 383 also come together to get between the shield members 351, 353 and the target material 161, to provide further coverage and protection for the shield members 351, 353.

The guard plates 381, 383 mainly serve to block the high-temperature matters or the heat created during the process of cleaning the reaction chamber 11 and the target material 161, from directly contacting the shield members 351, 353, such that to prevent thermal deformation and malicious effect occurring thereto.

Also to mention that, when the shield members 351, 353 are in the shielding state, the guard plates 381, 383 do not contact each other neither, in order to avoid a collision or friction therebetween from creating wear-off particles and hence to pollute the containing space 12 and/or the carrier 13 within the reaction chamber 11. Such that, as shown in FIG. 13 and FIG. 14, when the shield members 351, 353 are in the shielding state, the shield members 351, 353 maintain a first gap space 354 therebetween, the guard plates 381, 383 also maintain a second gap space 384 therebetween, wherein first gap space 354 and second the gap space 384 have some spatial overlap, in this embodiment. Moreover, the first-shield member 351 and the first-guard plate 381 both may be formed with similar half-round shapes and area sizes, and so do the second-shield member 353 and the second-guard plate 383.

In one embodiment of the present disclosure, the guard plates 381, 383 are connected to the shield members 351, 353 via a plurality of support units 385, and thereby a gap 382 is respectively formed between the first-guard plate 381 and the first-shield member 351, and between the second-guard plate 383 and the second-shield member 353. The gaps 382 can serve prevent the high temperature generated during the cleaning process from directly transferring from the guard plates 381, 383 into the shield members 351, 353, such that to further prevent the thermal deformation of the shield members 351, 353.

Figure 15:
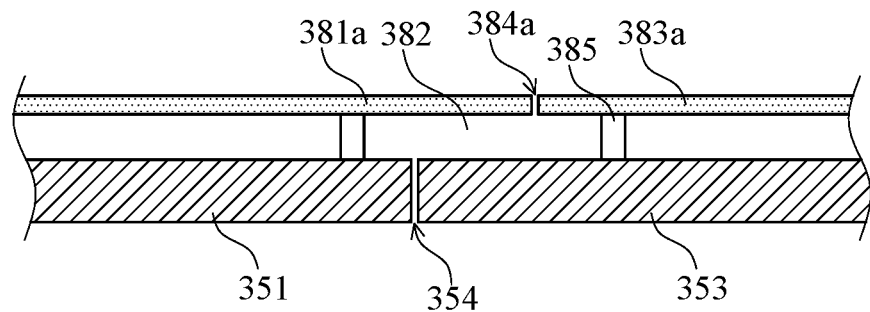
FIG. 15 is a schematic fragmentary sectional view illustrating the first-shield member and the second-shield member of the shielding device which are in the shielding state, according to yet another different embodiment of the present disclosure.

In yet another embodiment of the present disclosure, as shown in FIG. 15, the guard plates 381a, 383a and the shield members 351, 353 may be configured to have the first gap space 354a and the second gap space 384a not spatially overlap each other. In this embodiment, the two shield members 351, 353 have substantially identical area sizes, whereas the two guard plates 381a, 383a have different area sizes, such as the first-guard plate 381a may be formed larger than the second-guard plate 383a. However surely, in practical use, it may also be configured into an opposite manner, such as the two shield members 351, 353 have different area sizes, whereas the two guard plates 381a, 383a have substantially identical area sizes, which makes no spatial overlap between the first gap space 354a and the second gap space 384a as well.

When the first gap space 354 has no spatial overlap with the second gap space 384, the high-temperature matters and the heat of the cleaning process is prevented from directly passing through the second gap space 384 then the first gap space 354, and then to reach the carrier 13, thereby to improve the coverage for the carrier 13 and/or the substrate.

Figure 16:
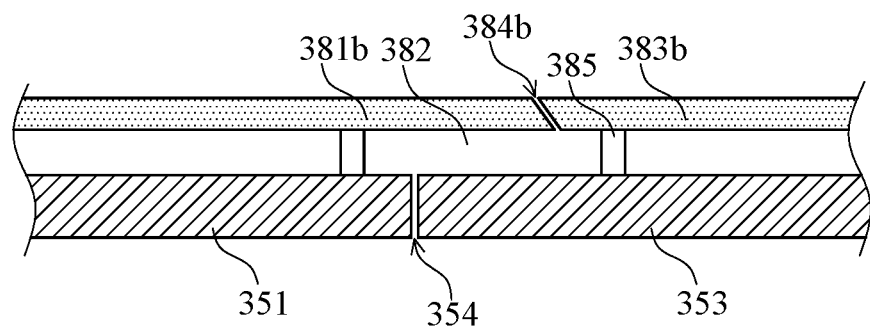
FIG. 16 is a schematic fragmentary sectional view illustrating the first-shield member and the second-shield member of the shielding device which are in the shielding state, according to one other different embodiment of the present disclosure.
Figure 17:
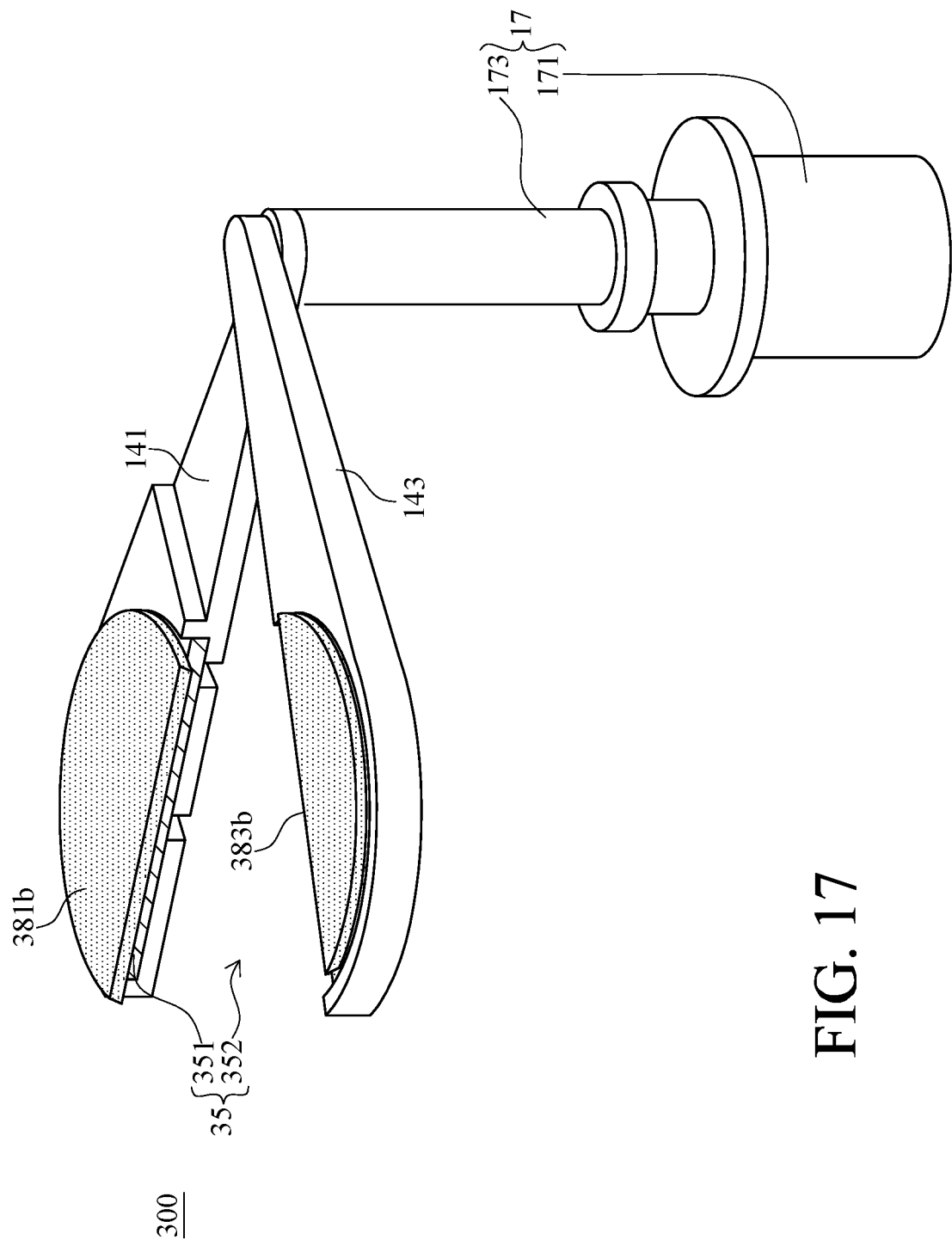
FIG. 17 is a schematic perspective view illustrating the shielding device of the thin-film-deposition equipment which is in the open state, according to yet another different embodiment of the present disclosure.

As shown in FIG. 16 and FIG. 17, in another different embodiment of the present disclosure, similar to the two shield members 351, 353, each of the two guard plates 381b, 383b has an inner-edge surface formed inclined relative to a top surface and a bottom surface thereof, wherein the inner-edge surfaces of the two guard plates 381b, 383b are also substantially parallel to each other. With such structure, when the two shield members 351, 353 are operated into the shielding state, the inner-edge surfaces of the two guard plates 381b, 383b face each other and form the second gap space 384b in an inclined manner relative to the first gap space 354 between the two shield members 351, 353, such that to tilt away from the second gap space 384b for preventing the pollutant from passing through and entering the first gap space 354, in a more effective manner. Surely, in other different embodiment, the two shield members 351, 353 may also be configured to have the inner-edge surfaces thereof formed in the inclined, substantially parallel manner, such that to tilt, orient both the first gap space and the second gap space, for a further effective performance against the falling pollutants.

In one embodiment of the present disclosure similar to the aforementioned one, along with the first-shield member 351 and the second-shield member 353 that are positioned in different heights, the first-guard plate 181 and the second-guard plate 183 can also be disposed in different heights, such as to have the first-shield member 351 positioned higher than the second-shield member 353, with the first-guard plate 381 also positioned higher than the second-guard plate 383. Such that, when in the shielding state, the first-shield member 351 partially covers top of the second-shield member 353 and hence overlaps therewith, the first-guard plate 381 also partially covers atop of the second-guard plate 183 and overlaps therewith, thereby to improve the coverage for the carrier 13 and/or the substrate.

Surely, along with the shield members 351, 353 that may be formed in different shapes, the guard plates 381, 383 may also be formed in any geometric shapes.

Figure 18:
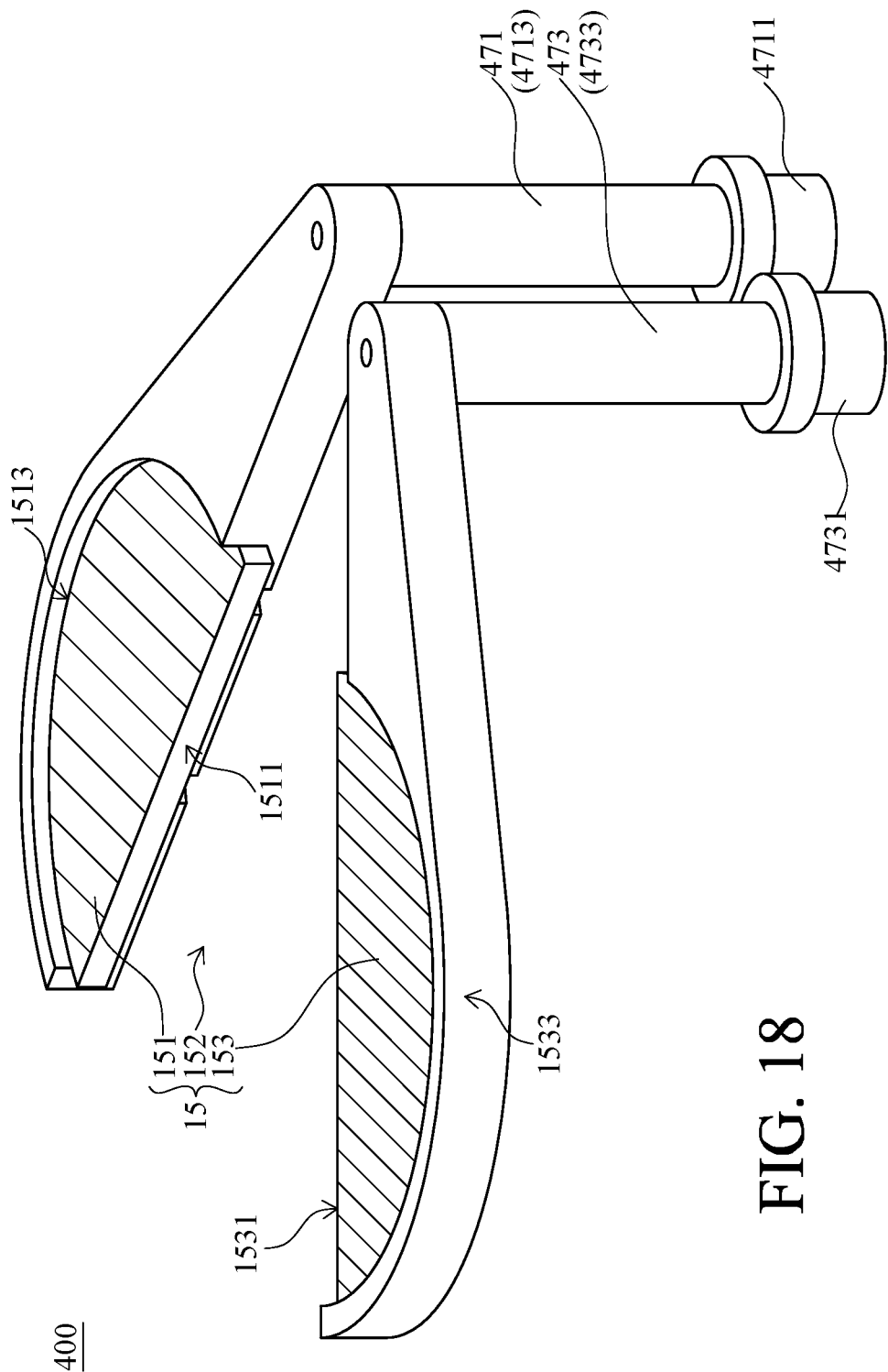
FIG. 18 is a schematic perspective view illustrating the shielding device of the thin-film-deposition equipment which is in the open state, according to one more embodiment of the present disclosure.

Referring to FIG. 18, which is a schematic perspective view illustrating the shielding device 400 of the thin-film-deposition equipment which is in the open state, according to one more embodiment of the present disclosure. In comparison with the aforementioned embodiment, the driver 47 in this embodiment is configured as a first driver 471 and a second driver 473. The first driver 471 and the second driver 473 are respectively connected power-transmittably to the first-shield member 151 and the second-shield member 153, such that to drive and swing the first-shield member 151 and the second-shield member 153 to move in the opposite directions. For example, the first-shield member 151 and the second-shield member 153 may synchronously sway in the opposite directions, respectively about an axle of the first driver 471 and an axle of the second driver 473.

To be specific, the first driver 471 and the second driver 473 can respectively drive, swing the first-shield member 151 and the second-shield member 153 to move away from each other into the open state, or to move toward each other into the shielding state.

In one embodiment of the present disclosure, the first driver 471 and the second driver 473 respectively include motors 4711, 4731 and shaft seals 4713, 4733, which are structures similar to the aforementioned motor 171 and shaft seal 173.

Also similar to the aforementioned embodiments, in practical use, the first driver 471 and the second driver 473 may be connected to the first-shield member 151 and the second-shield member 153, respectively via the first-carry arm 141 and the second-carry arm 143.

Surely, the first driver 471 and the second driver 473 may be configured to respectively connect to and drive the aforementioned first-shield member 251, 251a and the second-shield member 252, 252a, or even the first-shield member 351 and the second-shield member 352 with the first-guard plate 381 and the second-guard plate 383 thereon, to switch between the open state and the shielding state as well.

Moreover, in other embodiment, the two drivers 471, 473 may be disposed at or near by a corner of the containing space 12 or the reaction chamber 11, such that to allow the passage for the substrate or the gas-extraction pipeline disposed at the edge side of the containing space 12 or the reaction chamber 11.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition equipment, comprising:
 a reaction chamber comprising a containing space;
 a carrier disposed within the containing space and having a carry surface for carrying at least one substrate thereon; and
 a shielding device comprising:
  a first-carry arm that is disposed within the containing space and that is formed with a plurality of first-positioning slots;
  a second-carry arm that is disposed within the containing space and that is formed with a plurality of second-positioning slots;
  a first-shield member that has a surface disposed with a plurality of first pins, wherein the first-shield member is placed on the first-carry arm with the first pins positioned within the first-positioning slots;
  a second-shield member that has a surface disposed with a plurality of second pins, wherein the second-shield member is placed on the second-carry arm with the second pins positioned within the second-positioning slots; and
  a driver that interconnects and drives the first-carry arm and the second-carry arm to respectively sway and move the first-shield member and the second-shield member in opposite directions between an open state and a shielding state, wherein in the shielding state, the first-shield member and the second-shield member are placed on the carry surface of the carrier via the first pins and the second pins, such that the first-shield member and the second-shield member together cover the carrier.

2. The thin-film-deposition equipment according to claim 1, wherein the driver comprises a shaft seal and at least one motor, and the at least one motor is connected to the first-carry arm and the second-carry arm via the shaft seal.

3. The thin-film-deposition equipment according to claim 2, wherein the shaft seal comprises an outer tube and a main shaft; the outer tube has an inner space for containing the main shaft; the at least one motor is connected to the first-carry arm via the outer tube, and connected to the second-carry arm via the main shaft to synchronously drive the outer tube and the main shaft to rotate in the opposite directions respectively.

4. The thin-film-deposition equipment according to claim 1, wherein the first-carry arm has a first-inner-edge surface, the second-carry arm has a second-inner-edge surface; when in the shielding state, the first-inner-edge surface of the first-carry arm and the second-inner-edge surface of the second-carry arm face each other; and the first-positioning slots are formed as notches that are opened on the first-inner-edge surface, the second-positioning slots are formed as notches that are opened on the second-inner-edge surface.

5. The thin-film-deposition equipment according to claim 4, wherein the first-shield member comprises at least one first-shield aligner, and the second-shield member comprises at least one second-shield aligner; the first-carry arm is formed with at least one first-arm aligner, the second-carry arm is formed with at least one second-arm aligner; and the first-shield member is positioned on the first-carry arm by an engagement between the at least one first-shield aligner and at least one first-arm aligner, the second-shield member is positioned on the second-carry arm by an engagement between the at least one second-shield aligner and at least one second-arm aligner.

6. The thin-film-deposition equipment according to claim 1, further comprising two sensor areas connected to the reaction chamber, wherein each of the sensor areas has a sensing space fluidly connected to the containing space of the reaction chamber for respectively and partially containing the first-shield member and the second-shield member in the open state; each of the sensor areas is formed with a height shorter than that of the reaction chamber; and each of the sensor areas is disposed with at least one position sensor for respectively detecting the first-shield member and the second-shield member within the sensing spaces of the sensor areas.

7. The thin-film-deposition equipment according to claim 1, wherein the first-shield member of the shielding device comprises a first-inner-edge surface formed with at least one protrusion; the second-shield member of the shielding device comprises a second-inner-edge surface formed with at least one cavity; the at least one protrusion on the first-inner-edge surface corresponds to the at least one cavity on the second-inner-edge surface; and in the shielding state, the first-inner-edge surface of the first-shield member and the second-inner-edge surface of the second-shield member are adjacent to each other, the at least one protrusion on the first-inner-edge surface enters the at least one cavity on the second-inner-edge surface.

8. The thin-film-deposition equipment according to claim 1, wherein the shielding device further comprises a first-guard plate disposed on another surface of the first-shield member; and a second-guard plate disposed on another surface of the second-shield member; and the first-guard plate and the second-guard plate respectively move along with the first-shield member and the second-shield member, for guarding the first-shield member and the second-shield member.

9. The thin-film-deposition equipment according to claim 8, wherein in the shielding state, the first-shield member and the second-shield member have a first gap space therebetween; the first-guard plate and the second-guard plate have a second gap space therebetween; and the first gap space and the second gap space do not spatially overlap.

10. The thin-film-deposition equipment according to claim 9, wherein each of the first-guard plate and the second-guard plate has an inner-edge surface; and in the shielding state, the inner-edge surface of the first-guard plate and the inner-edge surface of the second-guard plate face each other to form the second gap space in an inclined manner relative to the first gap space.

11. A shielding device adapted to a thin-film-deposition equipment, comprising:
  a first-carry arm formed with a plurality of first-positioning slots;
  a second-carry arm formed with a plurality of second-positioning slots;
  a first-shield member having a surface that is disposed with a plurality of first pins, wherein the first-shield member is placed on the first-carry arm with the first pins positioned within the first-positioning slots;
  a second-shield member that having a surface that is disposed with a plurality of second pins, wherein the second-shield member is placed on the second-carry arm with the second pins positioned within the second-positioning slots; and
  a driver that interconnects and drives the first-carry arm and the second-carry arm to respectively sway and move the first-shield member and the second-shield member in opposite directions between an open state and a shielding state, wherein in the shielding state, the first-shield member and the second-shield member are placed on the carry surface of the carrier via the first pins and the second pins, and wherein in the open state, the first-shield member and the second-shield member have an open space therebetween.

12. The shielding device according to claim 11, wherein the first-carry arm has a first-inner-edge surface, the second-carry arm has a second-inner-edge surface; when in the shielding state, the first-inner-edge surface of the first-carry arm and the second-inner-edge surface of the second-carry arm face each other; and the first-positioning slots are formed as notches that are opened on the first-inner-edge surface, the second-positioning slots are formed as notches that are opened on the second-inner-edge surface.

13. The shielding device according to claim 11, wherein the first-shield member comprises at least one first-shield aligner, and the second-shield member comprises at least one second-shield aligner; the first-carry arm is formed with at least one first-arm aligner, the second-carry arm is formed with at least one second-arm aligner; and the first-shield member is positioned on the first-carry arm by an engagement between the at least one first-shield aligner and at least one first-arm aligner, the second-shield member is positioned on the second-carry arm by an engagement between the at least one second-shield aligner and at least one second-arm aligner.

14. The shielding device according to claim 11, wherein the driver comprises a shaft seal and at least one motor, and the at least one motor is connected to the first-carry arm and the second-carry arm via the shaft seal; the shaft seal comprises an outer tube and a main shaft; the outer tube has an inner space for containing the main shaft; the motor is connected to the first-carry arm via the outer tube, and connected to the second-carry arm via the main shaft to synchronously drive the outer tube and the main shaft to rotate in the opposite directions respectively.

15. The shielding device according to claim 11, wherein the first-shield member comprises a top surface, a bottom surface, and a first-inner-edge surface formed in an inclined manner relative to the top surface or the bottom surface; and wherein the second-shield member comprises a top surface, a bottom surface, a second-inner-edge surface relative to the top surface or the bottom surface.

16. The shielding device according to claim 11, wherein the first-shield member comprises a first-inner-edge surface formed with at least one protrusion; the second-shield member comprises a second-inner-edge surface formed with at least one cavity; the at least one protrusion on the first-inner-edge surface corresponds to the at least one cavity on the second-inner-edge surface; and in the shielding state, the first-inner-edge surface of the first-shield member and the second-inner-edge surface of the second-shield member are adjacent to each other, the at least one protrusion on the first-inner-edge surface enters the at least one cavity on the second-inner-edge surface.

17. The shielding device according to claim 11, further comprises:
a first-guard plate disposed on another surface of the first-shield member; and
a second-guard plate disposed on another surface of the second-shield member, wherein the first-guard plate and the second-guard plate respectively move along with the first-shield member and the second-shield member, for guarding the first-shield member and the second-shield member.

18. The shielding device according to claim 17, wherein in the shielding state, the first-shield member and the second-shield member have a first gap space therebetween; the first-guard plate and the second-guard plate have a second gap space therebetween; and the first gap space and the second gap space do not spatially overlap.

19. The shielding device according to claim 18, wherein each of the first-guard plate and the second-guard plate has an inner-edge surface; and in the shielding state, the inner-edge surface of the first-guard plate and the inner-edge surface second-guard plate face each other to form the second gap space in an inclined manner relative to the first gap space.

20. The shielding device according to claim 11, wherein the driver comprises a first driver connected to the first-carry arm, and a second driver connected to the second-carry arm; and the first driver and the second driver respectively drive and swing the first-carry arm and the second-carry arm to move the first-shield member and the second-shield member in the opposite directions between the open state and the shielding state.

\* \* \* \* \*